Sept. 11, 1962 H. J. KOBITTER Re. 25,243

SLIDE BRACKET MECHANISM

Original Filed July 10, 1959 2 Sheets-Sheet 1

Inventor
HENRY J. KOBITTER by Hill, Sherman, Meroni, Gross & Simpson Attys.

Sept. 11, 1962

H. J. KOBITTER

SLIDE BRACKET MECHANISM

Re. 25,243

Original Filed July 10, 1959

2 Sheets-Sheet 2

Inventor
HENRY J. KOBITTER by Hill, Sherman, Meroni, Gross & Simpson Attys.

United States Patent Office

Re. 25,243
Reissued Sept. 11, 1962

25,243

SLIDE BRACKET MECHANISM

Henry J. Kobitter, Deerfield, Ill.

Original No. 3,000,686, dated Sept. 19, 1961, Ser. No. 826,274, July 10, 1959. Application for reissue Jan. 8, 1962, Ser. No. 165,991
8 Claims. (Cl. 312—333)

Matter enclosed in heavy brackets [ ] appears in the original patent but forms no part of this reissue specification; matter printed in italics indicates the additions made by reissue.

The present invention relates broadly to mechanisms employed with slidable tray supporting brackets, and is more particularly concerned with a new and improved latch device of especial utility with extensible slide brackets mounted on cabinet side walls for pivotally supporting a chassis carrying electronic instruments.

It is an important aim of the present invention to provide a slide bracket mechanism featuring therein a novel latch assembly having among its advantages a positive locking action whereby accidental release of the latch means is prevented.

Another object of this invention lies in the provision of a locking and release mechanism for a slide bracket assembly attached to cabinet walls and supporting a chassis mounting electronic instruments to be moved outwardly from the cabinet and raised upwardly therefrom for access to the underside of the electronic instrument, the locking and release mechanism departing from existing structures in its simplified construction, ease of fabrication, reduced wear thereon and a substantially reduced vertical profile.

Still another object of the instant invention is to provide a locking and release device for the purposes indicated, and which embodies a latch member guided during vertical translation to thereby prevent lateral displacements and facilitating the releasing and locking action.

A still further object of the present invention is to provide an actuating assembly having locking and releasing functions and which embodies a pivotal locking member and horizontally movable lever member having only straight line reciprocal travel, the lever member being provided with a diagonally disposed slot receiving pin means on the locking member, whereby when straight line horizontal movement is imparted to the lever member the pin means on the locking member travels within the slot to pivotally move the locking member to or from a position of engagement or disengagement.

Other objects and advantages of the invention will become more apparent during the course of the following description, particularly when taken in connection with the accompanying drawings.

In the drawings, wherein like numerals designate like parts throughout the same:

Figures 3, 4:
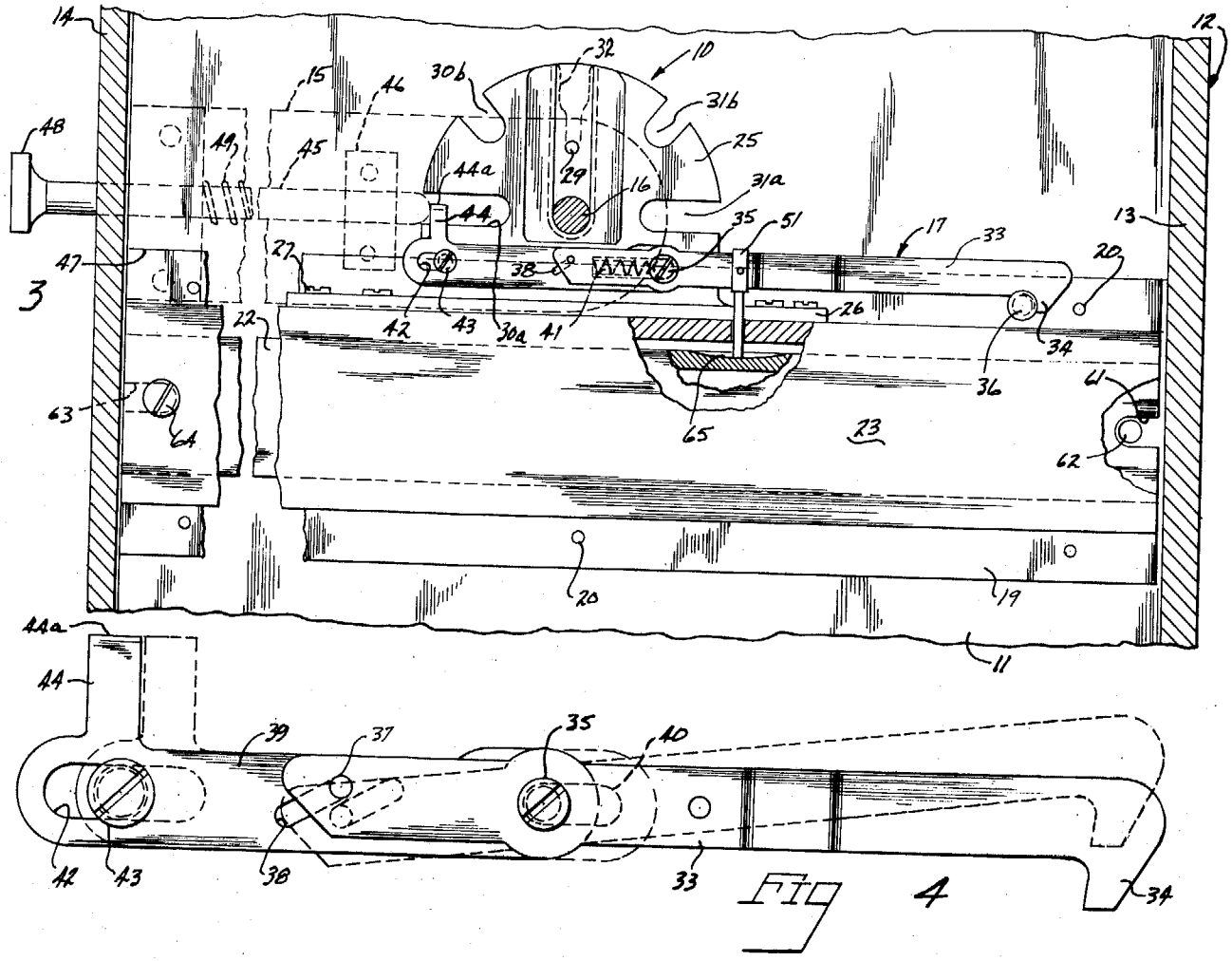

FIGURE 3 is a side elevational view of the slide bracket assembly, with parts broken away and with parts in section, and illustrating the assembly in a retracted position; and FIGURE 4 is a more or less enlarged side view of a latch assembly as provided in accordance with the principles of this invention, and illustrating in full line the relative position of the parts after locking and showing in dotted line the relative position of the parts during release.

Referring now to the drawings, there is shown a slide bracket mechanism generally designated by the numeral 10, a portion of which is secured in the manner to be described along the inner surfaces of side walls 11 (only one of which is shown) of a cabinet 12 having a rear wall 13. A tray or drawer 14 carrying the electronic equipment mounts an elongated plate 15 pivotally connected at 16 to the mechanism 10 secured to the cabinet 12. While only a single slide bracket mechanism 10 is illustrated in the drawings, it is appreciated that with the exception of a lock and release device generally designated as 17, a mechanism 10 is also mounted by the opposite side wall 11. By means of the slide bracket mechanism or assembly 10 herein disclosed, and as will be described in detail later, the tray or drawer 14 may be unlocked from the cabinet 12, slidably drawn rearwardly therefrom and pivoted about the point 16 through an angle of either 45° or 90° or 135° from the horizontal and lock thereat for access to the underside of the tray or drawer 14.

The slide bracket mechanism 10 comprises in addition to the locking and release device 17, a slide assembly generally indicated at 18, the details of which will now be described. The slide assembly 18 is provided by three portions generally, a stationary outer member or plate 19 attached at 20 to the cabinet side wall 11 and mounting generally centrally of the width thereof a rib or track 21 receiving for slidable contact an intermediate channel member 22 forming the second portion of the slide assembly. The third portion of the slide assembly 18 is an inner channel member 23 slidable upon the intermediate channel member 22 and mounting many of the components of the locking and release device 17. To provide the desired slidable movement of the intermediate channel member 22 with respect to the track 21 and slidable reciprocation of the inner channel member 23 relative to the intermediate channel member 22, the named parts are provided with suitable race-ways in the manner known to the art in which conventional ball bearing means 24 may run.

The locking and release device or mechanism 17 herein provided comprises an upstanding quadrant or semi-circular plate member 25 having a base flange 26 secured at 27 to the upper edge or surface of the inner channel member 23. The plate member portion 25 of the lock and release mechanism has formed on one surface thereof a generally U-shaped protuberance 25a providing a channel 25b receiving a block 28 threaded to the semi-circular plate member 25 at 29 to lock the pivot pin 16 firmly in place. The block 28 functions to prevent displacement of the pivotally mounted tray or drawer 14, and its removal is required when it is desired to remove said tray or drawer.

The plate 25 may be seen to be further formed with two sets of notches 30a–b and 31a–b extending radially and opening outwardly along the periphery thereof. The notches 30b and 31b, as compared with the notches 30a and 31a, are relatively shallow, and the notches 30a and 31a are spaced from the notches 30b and 31b, respectively, by an angle of about 45°. As appears in FIGURE 3, the plate member 25 has a notch 32 spaced approximately 45° from the notches 30b and 31b, and from the notches 30a and 31a by about an angle of 90°. The function of the named notches will now be described, and it will be noted therein that during use of the plate member 25 four notches may be employed, these being the notches 30a, 30b, 32 and 31b. In other words, the notch 31a is not used when the quadrant member is located upon the side wall 11 shown, and provided for use when an identical plate 25 is mounted on the opposite side wall 11 of the cabinet. In this case, the notches 31a, 31b, 32 and 30b would then be utilized. Accordingly interchangeability is provided.

As a feature of this invention, the locking and release device 17 further comprises a locking or latch member 33 provided with a downwardly formed hook 34 at one end thereof and pivotally connected at 35 to the quadrant member 25. The locking member may be seen in FIGURE 2 to be bent or shaped intermediate its opposite ends, and this has the advantage of reducing the required length of a lock-pin 36 secured to the stationary outer member 19. A possible interference of parts is thereby avoided, and in certain applications it may be found that the vertical profile of the slide bracket mechanism 10 is reduced.

To actuate the locking member 33 for pivotal movement about the point 35, the member 33 carries adjacent one end on its outwardly facing surface pin means 37 (FIGURE 4) received for reciprocal travel in a diagonally disposed elongated slot 38 provided in a lever member 39. The lever member 39 is partially overlapped by the locking arm 33 and the pivot pin 35 extends therethrough into the quadrant plate 25. The lever member 39 is received upon the pivot pin 35 by a horizontally arranged elongated slot 40, and bottoming at one end in the slot 40 and at its opposite end against the pivot pin 35 is spring means 41 urging the lever member 39 rearwardly or to the left as viewed in the drawings. Separate spring means are not herein provided to return the latch arm 33 to a down position, since it has been found that adequate pivotal downward movement of the arm 33 is accomplished by travel of the pin 37 in the slot 38 under the resilient action of the spring means 41. However, a vertically arranged spring could be attached to the locking member 33 and to either the base flang 26 of the quadrant member 25 or to the upper edge of the stationary outer member 19.

The opposite end of the lever member 39 has formed therein a generally horizontally arranged elongated slot 42 receiving pin means 43 which may be threaded into the quadrant member 25. It may now be seen that by provision of the horizontal slots 40 and 42 in the lever member 39 and the pin means 35 and 43 received therein, in combination with diagonal slot 38 receiving the pin 37 on the latch arm 33, the lever member 39 travels solely in a horizontal plane or in a straight line to force the pin either downwardly and rearwardly in the slot 38 or forwardly and upwardly therein, depending upon the direction of straight line travel of the lever member 39, to swing or pivot the locking member 33 from the full line position shown in FIGURE 4 to the dotted line location also indicated. It is to be further observed that in this invention there is no pivotal connection between the locking member 33 and lever member 39 at the end of the locking member carrying the pin 37, and further, there is no pivotal or vertical swinging of the lever member 39.

The described structure of locking arm 33 and lever member 39, and the arrangement of one with respect to the other, has a number of important advantages. First, when the locking member 33 is in the down or latched position with its hook portions 34 engaging the lock pin 36, it is not possible without straight line reciprocation of the lever member 39 to disengage the hook 34 from the pin 36. In other words, simply by a jarring of the chest or drawer 14, or other inadvertent or accidental movement of the parts, it is not possible to unlock the arm 33. Thus, when no movement is imparted to the lever member 39, the pin means 37 on the locking arm 33 is held essentially rigid in the slot 38 and prevents raising the locking arm to an unlatched position.

Another advantage of the described construction is that there is relatively less wear on the parts since only straight line or horizontal movement of the lever member 39 is provided. Also, the slot and pin configurations are relatively easy to fabricate. In addition, it may be noted upon reference to FIGURE 2 that the right or front end of the lever member 39 is interposed between the locking arm 33 and the quadrant member 25. Thereby, when the lever member 39 is reciprocated from the full to dotted line position of FIGURE 4, the forward or right end of the lever member 39 advances along the adjacent end of the locking member 33 to provide a guide stabilizing the locking arm during pivotal upward movement. Thereby, a more effective release of the hook portion 34 from the pin 36 is effected, and the locking arm 33 is continuously vertically aligned with the locking pin to effect proper securement therewith upon downward pivotal or swinging travel.

The lever member 39 at the end thereof provided with the slot 42 has an upwardly extending arm 44 angularly bent outwardly at its uppermost end for reception in the notch 30a of the quadrant member 25. Bearing against the arm portion 44 on the lever member 39 to effect straight line reciprocation of the member 39 and pivoting of the locking member 33 is a locking and releasing rod 45 longitudinally slidable in bearing blocks 46 and 47 mounted by the elongated plate 15, which as noted, is secured to the tray or drawer 14. It may be seen from the drawings that one end of the locking and releasing rod 45 is normally partially received in the notch 30a of the semi-circular plate 25, and the opposite end of the rod 45 extends through the front panel of the tray or drawer 14 and is provided with a finger hold or handle 48. The rod 45 is encircled by a spring 49 which bottoms at one end against the bearing block 47 and at its opposite end against a collar 50 supported by the rod 45. It may now be seen that the function of the spring 49 is to urge the right or rearward end of the rod 45 into the notch 30a and continuously maintain the same therein.

Movement of the rod 45 rearwardly against angular end 44a imparts straight line reciprocation to the lever member 39 and upward pivotal movement of the locking arm 33 to release the hook portion 34 thereof from the locking pin 36, as has been described. Withdrawal of rod 45 by a pulling action upon the finger hold 48 removes the right or rearward end of the rod 45 from the notch 30a. The elongated plate 15, attached to the tray or drawer 14, is pivotally supported upon the pivot point 16, and accordingly, the tray or drawer 14 with the rod 45 withdrawn from the notch 30a may be rotated or tilted counterclockwise through an agle of either 45° or 90° or 135°. The 45° position would find the plunger rod 45 received in the notch 30b of the quadrant member 25, and in the 90° position, the rod end would be received in the notch 32 in the quadrant member. When the 45° or 90° position represented by the notches 30b and 32 are reached, the finger engagement on the handle 48 is merely released and the plunger rod end seats in either of the named notches to firmly lock the tray or drawer 14 in a raised position for access to the underside thereof.

Figures 1, 2:
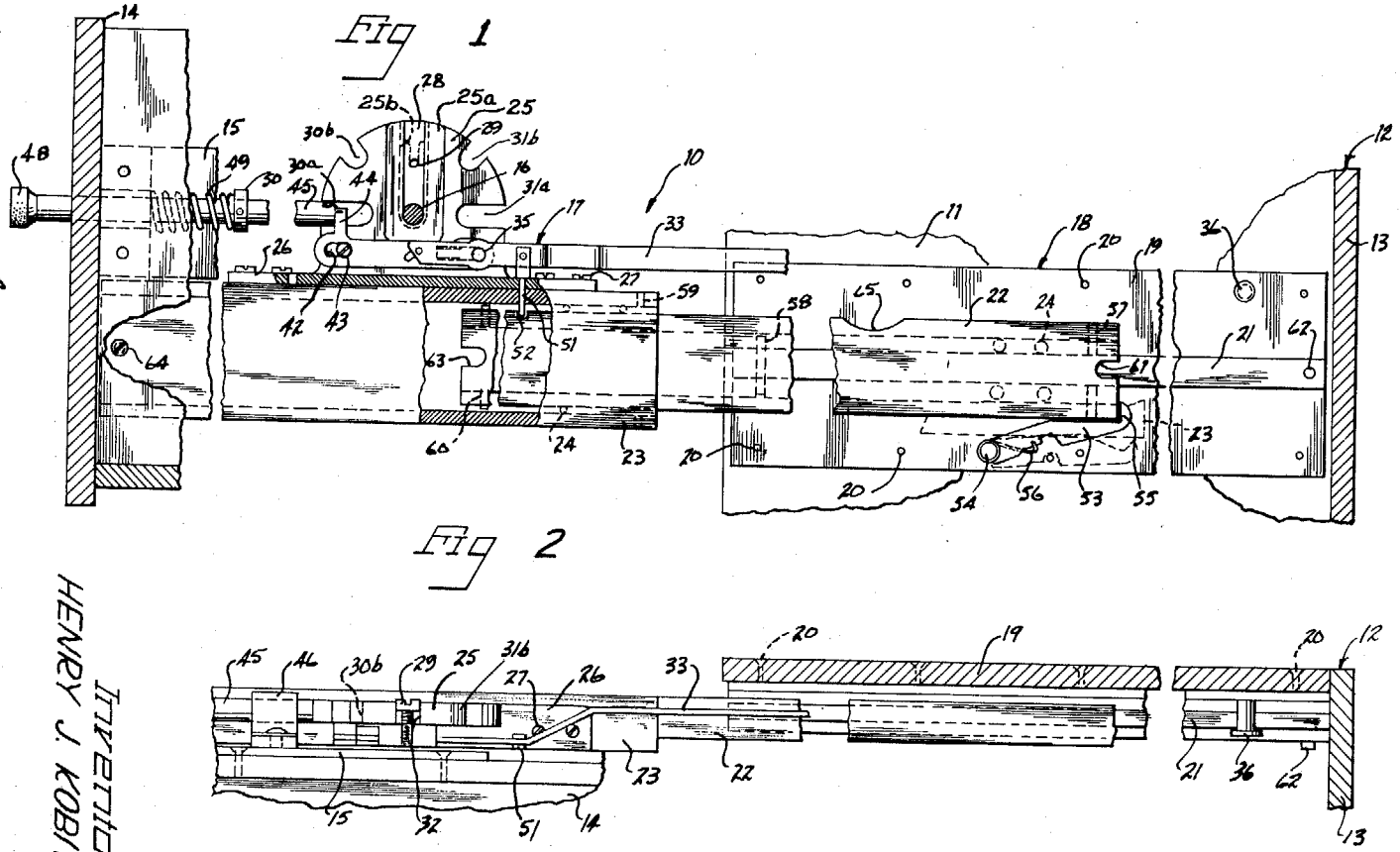
FIGURE 1 is a side elevational view of a slide bracket assembly, with parts broken away to more clearly illustrate the details thereof, and showing the relative position of the parts when the assembly is essentially fully extended.
FIGURE 2 is a top plan view of the assembly of FIGURE 1.

The intermediate channel member 22 is locked to the inner channel member 23 by means of a locking pin 51 pivotally attached to the latch arm 33 and depending therefrom through orifices in the flanged base 26 of the semi-circular member 25 and in the inner channel member 23 to engage in a pocket or notch 52 in the top flange of the intermediate channel member 22. The intermediate channel member 22 is locked to the stationary outer member 19 when the parts are extended by means of a latch 53 pivotally supported or carried by the stationary outer member 19, as at 54. The latch 53 has a hook 55 at one end engaging the lower free corner of the intermediate channel member 22, and is urged into this position under action of a spring 56. The latch 53 is designed to maintain the channel member 22 in position when said member is fully extended, and to release the locking contact between the channel member 22 and outer member 19 when the parts are retracted. In FIGURE 1 the downward position of the latch 53 is indicated in dotted lines, and its position with reference to the inner channel member 23 when said member is retracted is also shown therein.

In addition to performing a normal bearing function, the ball bearing means 24 in the race-ways between the track 21 and intermediate channel member 22 and between the latter member and the inner channel 23 further function to limit outward movement of the sliding channel members. The ball bearing means 24 are of the conventional type in which the ball portions seat in apertures in metal strips at spaced locations therealong. To function as stop means the length of the strip portion of the bearing means 24 in the race-ways between the track 21 and the intermediate channel member 22 are gauged to bring to a stop the channel member 22 when pins 57 and 58 extending into the upper and lower race-ways contact opposite ends of the ball bearing means 24. Similarly, pin means 59 and 60 in the upper and lower race-ways between the inner channel member 23 and intermediate channel member 22 contact opposite ends of the ball bearing means 24 therein to limit outward movement of the inner channel member 23 with respect to the intermediate member 22.

The inner end of the intermediate channel member 22 is formed with a slot 61 to engage a pin 62 upon the track 21 when the intermediate member 22 is fully retracted, and similarly, the opposite end of the intermediate channel member 22 has a slot 63 formed therein to engage a pin 64 extending through the wall of the inner channel member 23. To permit the pin 51 to drop and to allow the hook portion 34 on the locking arm 33 to engage the locking pin 36, the upper surface of the intermediate channel member 22 may have a generally concave depression 65 formed therein.

The operation of the slide bracket mechanism 10 of this invention will now be described. As shown in FIGURE 3, when the parts are retracted the locking arm 33 by means of the hook portion 34 thereon engages the lock pin 36 on the stationary outer member 19. To slide the tray or drawer 14 outwardly from the cabinet 12, the plunger rod 45 is pressed inwardly, which moves the lever member 39 in a straight line horizontal direction. The lever member is guided in this direction by provision therein of the slots 40 and 42 receiving the pins 35 and 43, respectively. During rearward straight line movement of the lever 39, the pin 37 on the locking arm 33 travels downwardly and forwardly in the slot 38 in the lever 39, which tilts or pivots the locking arm 33 about the pivot point 35 to the dotted line position in FIGURE 4, a which location the hook portion 34 is released from the locking pin 36. The locking arm 33 remains in the raised position only if the plunger rod 45 is continuously depressed in opposition to the spring 49 thereon, and when depressed and the lever member 39 moved rearwardly, the spring means 41 in the slot 40 of the lever member 39 is compressed. Accordingly, when the plunger rod 45 has the pressing force thereon released, it moves forwardly or to the left to generally the position of FIGURE 3, and simultaneously, the spring 41 returns the lever member 39 to the full line position of FIGURE 4, and carries with it the locking arm 33 which then returns to its original downward position.

After the releasing action described has taken place, and during withdrawal of the tray or drawer 14, the depending pin 51 rises out of the depression 65 and rides along the upper surface of the intermediate channel member 22 until it reaches the pocket or notch 52 in the upper surface of the channel member 22. Continued outward tray movement draws the intermediate channel member 22 outwardly, and when said member reaches the extent of its predetermined outward movement, the latch 53 swings upwardly to engage the extreme inner end of this member and lock the same to the stationary outer member 19. It may now be seen that the intermediate channel member 22 is locked to the stationary outer member 19, and the inner channel member 23 is locked to the intermediate channel member 22. The tray or drawer 14 may then be tilted upwardly to an angle of 45° or 90° or 135° by withdrawing the plunger rod 45 and releasing the same for engagement with either of the notches 30b or 32 or 31b, as earlier described.

To return the tray or drawer 14 to a horizontal position preparatory to moving the same into the cabinet 12, the plunger rod 45 is drawn outwardly to release the end thereof from either of the notches 30b or 32 or 31b. The tray or drawer 14 is then tilted counter-clockwise to a horizontal position and given inwardly directed movement, whereupon the inner channel member 23 rolls along the intermediate channel member 22 with the locking pin 51 sliding along the top of the intermediate member 22 until it reaches the depression 65 to permit the locking arm 33 to drop into the horizontal or full line position of FIGURE 4. Simultaneously, the latch 53 is disengaged from the inner channel member 23, the pin 64 moves into the slot 63 to drive the intermediate channel member 22 further into the cabinet, and during this action the hook end 34 of the latch member 33 contacts the locking pin 36 to secure the parts one to the other in a fully retracted position. At this time, the slot 61 in the intermediate channel member 22 engages the stop pin 62 on the tract 21. As now positioned, the tray or drawer 14 is locked in a retracted position within the cabinet 12, and to withdraw the same from the cabinet the plunger rod 45 must again be pushed forwardly to initiate the sequence first described.

It may now be seen that applicant has provided a new and improved locking and release mechanism which effectively insures that the locking arm 33 will not become disengaged from the lock pin 36 without the initiation of the intended positive action described. Pivotal movement of the lever member is herein eliminated, and by straight line reciprocation and the pin and slot arrangement described, a more reliable release of the locking arm 33 is effected. Further, excessive wear on the parts cannot occur by the simplified movement herein provided, and all parts may be fabricated at relatively low cost. In addition, positive guiding means are herein provided for the locking arm 33, and it is thereby assured that the locking arm 33 will always be in a ready position for return to a locked position upon the pin 36.

It is of course to be understood that various changes and modifications may be made to the structures herein disclosed without departing from the novel concepts of the present invention.

I claim:

[1. A slide bracket mechanism for pivotally mounting a tray from a cabinet and releasably locking said tray thereto, comprising a slide assembly and a locking device; the slide assembly including a stationary member attached to the cabinet and at least one movable member slidable relative to the stationary member during extension and retraction of the slide assembly; the locking device including a quadrant member secured to the stationary member and having notches formed therein, a slidable rod supported by the tray and having one end engageable with the notches to maintain the tray in a particular position relative to the cabinet after extension and rotation with respect thereto, a lever member having a pair of horizontally arranged slots therein and provided with a turned portion received in one of the notches in the quadrant member, pin means received in each of the slots in the lever member and attaching said members to the quadrant member, and a locking member pivotally supported by the quadrant member on one of the pin means and free of pivotal connection with the lever member, said lever member being driven in a straight line and horizontal direction by the slidable rod acting against the turned portion thereon whereby the slots in the lever member move along the pin means and the locking member is pivoted vertically to lock or release the tray to or from the stationary member.]

[2. A slide bracket mechanism for pivotally mounting a tray from a cabinet and releasably locking said tray thereto, comprising a slide assembly and a locking device; the slide assembly including a stationary member attached to the cabinet and at least one movable member slidable relative to the stationary member during extension and retraction of the slide assembly; the locking device including a quadrant member secured to the stationary member and having notches formed therein, a slidable rod supported by the tray and having one end engageable with the notches to maintain the tray in a particular position relative to the cabinet after extension and rotation with respect thereto, a lever member having a pair of horizontally arranged solts therein and provided with a turned portion received in one of the notches in the quadrant member, pin means received in each of the slots in the lever member and attaching said member to the quadrant member, a locking member pivotally supported by the quadrant member on one of the pin means and free of pivotal connection with the lever member, said lever member being driven in a straight line and horizontal direction by the slidable rod acting against the turned portion thereon whereby the slots in the lever member move along the pin means and the locking member is pivoted vertically to lock or release the tray to or from the stationary member, and resilient means in the slot in the lever member receiving the pivot pin means for the locking member returning the lever member in a straight line direction and the locking member to a down position when the slidable rod is released from positive driving engagement with the turned portion on the lever member.]

3. A slide bracket mechanism for pivotally mounting a tray *and for movement of the tray into and* from a cabinet and releasably locking said tray thereto, comprising a slide assembly and a locking device; the slide assembly including a stationary member *to be* attached to the cabinet and at least one movable member *supportingly attachable to the tray and* slidable relative to the stationary member during extension and retraction of the slide assembly; the locking device including a quadrant member secured to the [stationary] *movable* member and having notches formed therein, a slidable rod supported by the tray and having one end engageable with the notches to maintain the tray in a particular position relative to the cabinet after extension and rotation with respect thereto, a lever member having an angularly disposed elongated slot formed therein and supported by the guadrant member for straight line and horizontal movement relative thereto, said lever member being provided with an angularly bent portion received in one of the notches in the quadrant member to be driven therealong by movement of the slidable rod, and a latching arm pivotally mounted on the quadrant member and provided with pin means received in the angularly disposed slot in the lever member and movable therealong during straight line reciprocation of the lever member to swing the latching arm vertically to a position locking the tray to the stationary member or releasing the same therefrom.

4. A slide bracket mechanism for pivotally mounting a tray *and for movement of the tray into and* from a cabinet and releasably locking said tray thereto, comprising a slide assembly and a locking device; the slide assembly including a stationary member *to be* attached to the cabinet and at least one movable member *supportingly attachable to the tray and* slidable relative to the stationary member during extension and retraction of the slide assembly; the locking device including a quadrant member secured to the [stationary] *movable* member and having notches formed therein, a slidable rod supported by the tray and having one end engageable with the notches to maintain the tray in a particular position relative to the cabinet after extension and rotation with respect thereto, a lever member having a pair of spaced horizontally arranged elongated slots formed therein and an angularly disposed elongated slot therebetween, said lever member being provided with an angularly bent portion received in one of the notches in the quadrant member to be driven therealong by movement of the slidable rod, screw means received in each of the horizontal slots in the lever member and attaching said member loosely to the quadrant member, and a latching arm pivotally mounted by the quadrant member on one of the screw means and supporting pin means received in the angularly arranged slot in the lever member, whereby during straight line reciprocation of said lever member with the screw means in the horizontal slots guiding the lever member the pin means on the latching arm follows the angularly arranged slot to pivot the latching arm to a position locking the tray to the stationary member or releasing the same therefrom.

5. A slide bracket mechanism for pivotally mounting a tray *and for movement of the tray into and* from a cabinet and releasably locking said tray thereto, comprising a slide assembly and a locking device; the slide assembly including a stationary member *to be* attached to the cabinet and at least one movable member *supportingly attachable to the tray and* slidable relative to the stationary member during extension and retraction of the slide assembly; the locking device including a quadrant member secured to the [stationary] *movable* member and having notches formed therein, a slidable rod supported by the tray and having one end engageable with the notches to maintain the tray in a particular position relative to the cabinet after extension and rotation with respect thereto, a lever member having a pair of spaced horizontally arranged elongated slots formed therein and an angularly disposed elongated slot therebetween, said lever member being provided with an angularly bent portion received in one of the notches in the quadrant member to be driven therealong by movement of the slidable rod, screw means received in each of the horizontal slots in the lever member and attaching said member loosely to the quadrant member, a latching arm pivotally mounted by the quadrant member on one of the screw means and supporting pin means received in the angularly arranged slot in the lever member, whereby during straight line reciprocation of said lever member with the screw means in the horizontal slots guiding the lever member the pin means on the latching arm follows the angularly arranged slot to pivot the latching arm to a position locking the tray to the stationary member or releasing the same therefrom, and resilient means in the horizontal slot in the lever member receiving the pivot screw means for the latching arm returning the lever member in a straight line direction and the latching arm to a down position when the slidable rod is released from positive driving engagement with the angularly bent portion on the lever member.

6. A slide bracket mechanism for pivotally mounting a tray *and for movement of the tray into and* from a cabinet and releasably locking said tray thereto, comprising a slide assembly and a locking device; the slide assembly including a stationary member *to be* attached to the cabinet and at least one movable member *supportingly attachable to the tray and* slidable relative to the stationary member during extension and retraction of the slide assembly; the locking device including a quadrant member secured to the [stationary] *movable* member and having notches formed therein, a slidable rod supported by the tray and having one end engageable with the notches to maintain the tray in a particular position relative to the cabinet after extension and rotation with respect thereto, a lever member and cooperating means on said lever member and on said quadrant member for supporting said lever member and providing straight line and horizontal movement of said lever member relative to said quadrant member, said lever member having a turned portion received in one of the notches to be driven therealong by movement of the slidable rod, a latching arm pivotally mounted on the quadrant member, and means connecting the latching arm to the lever member and translating straight line movement of the lever member into pivotal movement of the latching arm when the lever member is moved by said slidable rod, the tray being thereby locked to and released from the stationary member and the latching arm and lever member being free of pivotal connection one to the other.

[7. A slide bracket mechanism for [pivotally] mounting a tray from a cabinet and releasably locking said tray thereto, comprising a slide assembly and a locking device; the slide assembly including a stationary member attached to the cabinet and at least one movable member slidable relative to the stationary member during extension and retraction of the slide assembly; the locking device including a plate member secured to the stationary member, a lever member having a pair of horizontally arranged slots therein and provided with an upstanding portion, a slidable rod supported by and extending outwardly from the tray and having one end engageable with the upstanding portion of the lever member, pin means received in each of the slots in the lever member and attaching the lever member to the plate member, and a locking member pivotally supported by the plate member on one of the pin means and free of pivotal connection with the lever member, the lever member being driven in a straight line and horizontal direction by the slidable rod acting against the upstanding portion thereon whereby the slots in the lever member move along the pin means and the locking member is pivoted vertically to lock or release the tray to or from the stationary member.]

[8. A slide bracket mechanism for [pivotally] mounting a tray from a cabinet and releasably locking said tray thereto, comprising a slide assembly and a locking device; the slide assembly including a stationary member attached to the cabinet and a pair of movable members slidable relative to the stationary member and relative to one another during extension and retraction of the slide assembly, one of the movable members having a notch therein and the other of said movable members a pin-receiving opening; the locking device including a plate member secured to the stationary member, a lever member having a pair of horizontally arranged slots therein and provided with an upstanding portion, a slidable rod supported by and extending outwardly from the tray and having one end engageable with the upstanidng portion of the lever member, pin means received in each of the slots in the lever member and attaching the lever member to the plate member, a locking member pivotally supported by the plate member on one of the pin means and free of pivotal connection with the lever member, a pin member carried by the locking member and received in the notch in said one movable member and in the pin-receiving opening in said other movable member to lock said movable members one to the other, and latch means mounted on the stationary member and engageable with one end of said one movable member to lock said one movable member to the stationary member when the slide assembly is fully extended, the lever member being driven in a straight line and horizontal direction by the slidable rod acting against the upstanding portion thereon whereby the slots in the lever member move along the pin means and the locking member is pivoted vertically to retract the pin member from the notch in said one movable member, permitting said one and said other movable members to slide relative to the stationary member and the latch means to engage said one movable member, thereby locking the tray to the stationary member.]

*9. A slide bracket mechanism for pivotally mounting a tray and for movement of the tray into and from a cabinet and releasably locking said tray thereto, comprising a slide assembly and a locking device; the slide assembly including a stationary member attachable to the cabinet and at least one movable member supportingly attachable to the tray and slidable relative to the stationary member during extension and retraction of the slide assembly; the locking device including a quadrant member secured to the movable member and having notches formed therein, a slidable rod supported by the tray and having one end engageable with the notches to maintain the tray in a particular position relative to the cabinet after extension and rotation with respect thereto, a lever member having a pair of horizontally arranged slots therein and provided with a turned portion received in one of the notches in the quadrant member, pin means received in each of the slots in the lever member and attaching said lever member to the quadrant member for relative longitudinal movement, a locking member pivotally supported by the quadrant member on one of the pin means and free of pivotal connection with the lever member, coactive means on the lever member and the locking member effective when said lever member is driven longitudinally by the slidable rod acting against said turned portion thereon to pivot the locking member, and means on the locking member and on the stationary member interengageable to lock the tray to the stationary member but being releasable by rocking of the locking member.*

*10. A slide bracket mechanism for pivotally mounting a tray and for movement of the tray into and from a cabinet and releasably locking said tray thereto, comprising a slide assembly and a locking device; the slide assembly including a stationary member attachable to the cabinet and at least one movable member supportingly attachable to the tray and slidable relative to the stationary member during extension and retraction of the slide assembly; the locking device including a quadrant member secured to the movable member and having notches formed therein, a slidable rod supported by the tray and having one end engageable within the notches to maintain the tray in a particular position relative to the cabinet after extension and rotation with respect thereto, a lever member having a pair of horizontally arranged slots therein and provided with a turned portion received in one of the notches in the quadrant member, pin means received in each of the slots in the lever member and attaching sail lever member to the quadrant member for relative longitudinal movement, a locking member pivotally supported by the quadrant member on one of the pin means and free of pivotal connection with the lever member, coactive means on the lever member and the locking member effective when said lever member is driven longitudinally by the slidable rod acting against said turned portion thereon to pivot the locking member, means on the locking member and on the stationary member interengageable to lock the tray to the stationary member but being releasable by rocking of the locking member, and resilient means in the slot in the lever member receiving the pin means for the locking member for returning the lever member longitudinally and thereby effecting action of the coactive means to return the locking member to locking position when the slidable rod is released from driving action with respect to the turned portion on the lever member.*

*11. A slide bracket mechanism for mounting a tray for movement from a cabinet and releasably locking said tray thereto, comprising a slide assembly and a locking device;*

*the slide assembly including*

*a stationary member attachable to the cabinet, and at least one movable member slidable relative to the stationary member during extension and retraction of the slide assembly;*

*the locking device including*

*a plate member secured to the movable member,*

*a lever member having a pair of longitudinally arranged slots therein and provided with an arm portion,*

*pin means received in each of the slots in the lever member and longitudinally movably attaching the lever member to the plate member*

*a slidably mounted rod extending outwardly from the tray and having one end engageable with said arm portion,*

*a locking member pivotally supported by the plate member and free of pivotal connection with the lever member,*

*said locking member having means lockingly en*

*gageable with coactive means on the slide assembly for maintaining the movable member in selected locked position relative to the stationary member and being pivotally movable to release said lockingly engageable means,*

*the lever member being adapted to be longitudinally movably driven along the pin means by said rod acting against said arm portion,*

*and coactive means on the lever member and the locking member effective when the lever member is moved longitudinally by the rod to pivot the locking member to effect release of said lockingly engageable means.*

*12. A slide bracket mechanism for mounting a tray for movement from a cabinet and releasably locking said tray thereto, comprising a slide assembly and a locking device;*

*the slide assembly including*

*a stationary member attachable to the cabinet, and a pair of movable members slidable relative to the stationary member and relative to one another during extension and retraction of the slide assembly,*

*one of the movable members having a pin-receiving opening and the other of said members having a notch therein;*

*the locking device including*

*a plate member secured to said one movable member,*

*a lever member having a pair of longitudinally arranged slots therein and provided with an arm portion,*

*pin means received in each of said slots in the lever member and longitudinally movably attaching the lever member to the plate member,*

*a slidably mounted rod arranged to extend outwardly from the tray and having an end portion engageable with said arm,*

*a locking member pivotally supported by the plate member and free of pivotal connection with the lever member,*

*a pin member carried by the locking member and extending through said pin-receiving opening and lockingly receivable in said notch to lock said movable members together,*

*said locking member being pivotally movable to release said pin member,*

*and coactive means on the lever member and the locking member effective when the lever member is moved longitudinally by the rod to pivot the locking member to retract the pin member from the notch and thereby enabling relative movement of said movable members.*

References Cited in the file of this patent

UNITED STATES PATENTS 2,788,253 Gussack ---------- Apr. 9, 1957